(12) United States Patent
Guo et al.

(10) Patent No.: US 11,910,668 B2
(45) Date of Patent: Feb. 20, 2024

(54) DISPLAY PANEL AND MANUFACTURING METHOD THEREOF, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yonglin Guo, Beijing (CN); Kai Zhang, Beijing (CN); Dan Cao, Beijing (CN); Sangwon Lee, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 427 days.

(21) Appl. No.: 17/419,325

(22) PCT Filed: Feb. 27, 2020

(86) PCT No.: PCT/CN2020/076935
§ 371 (c)(1),
(2) Date: Jun. 29, 2021

(87) PCT Pub. No.: WO2021/168728
PCT Pub. Date: Sep. 2, 2021

(65) Prior Publication Data
US 2022/0310754 A1    Sep. 29, 2022

(51) Int. Cl.
*H10K 59/131* (2023.01)
*H10K 59/12* (2023.01)
(Continued)

(52) U.S. Cl.
CPC ......... *H10K 59/131* (2023.02); *H10K 59/126* (2023.02); *H10K 59/1213* (2023.02);
(Continued)

(58) Field of Classification Search
CPC ........... H10K 59/1213; H10K 59/1216; H10K 59/131; H10K 50/865; H10K 59/126;
(Continued)

(56) References Cited

U.S. PATENT DOCUMENTS

2014/0098078 A1* 4/2014 Jeon ................ H10K 59/1216
345/82
2015/0102303 A1* 4/2015 Kim .................. H10K 59/1213
257/40

(Continued)

FOREIGN PATENT DOCUMENTS

CN            1106898 A   *   1/2020   ......... H01L 23/4093

Primary Examiner — Didarul A Mazumder
(74) Attorney, Agent, or Firm — The Webb Law Firm (57) ABSTRACT

Provided are a display panel and a manufacturing method thereof, and a display device. At least one sub-pixel comprises a light emitting element; a first transistor comprising a first active layer comprising first and second electrode regions connected to data line and power line respectively; a capacitor; a second transistor comprising a second active layer; a third transistor comprising a third gate connected to a reset line, and a third active layer comprising a third channel region. Orthographic projections of the power line, the reset line, the third channel region and the data line are first, second, third and fourth projections respectively. The region of first, second, and third projections overlapping with each other is first region, and regions of first projection overlapping with second projection and not overlapping with third projection comprise a third region and a second region having an area not smaller than the third region.

20 Claims, 6 Drawing Sheets

(51) Int. Cl.
*H10K 59/126* (2023.01)
*H10K 59/121* (2023.01)
*H10K 71/00* (2023.01)

(52) U.S. Cl.
CPC ......... *H10K 59/1216* (2023.02); *H10K 71/00* (2023.02); *H10K 59/1201* (2023.02)

(58) Field of Classification Search
CPC ............... H01L 27/1255; H01L 27/124; H01L 27/1218; G09G 3/3225
USPC ........................................ 257/40; 438/82, 99
See application file for complete search history.

(56) References Cited

U.S. PATENT DOCUMENTS

| | | | |
|---|---|---|---|
| 2017/0317155 A1* | 11/2017 | Oh | H10K 59/1213 |
| 2019/0081090 A1* | 3/2019 | Lee | H10K 59/126 |
| 2020/0075702 A1* | 3/2020 | Zhang | H10K 59/35 |

* cited by examiner

Fig. 9B

DISPLAY PANEL AND MANUFACTURING METHOD THEREOF, AND DISPLAY DEVICE

CROSS-REFERENCE TO RELATED APPLICATION

The present application is a U.S. National Stage Application under 35 U.S.C. § 371 of International Patent Application No. PCT/CN2020/076935, filed on Feb. 27, 2020, the disclosure of which is incorporated by reference herein in its entirety.

TECHNICAL FIELD

The present disclosure relates to a display panel and a manufacturing method thereof, and a display device.

BACKGROUND

In recent years, due to the characteristics such as self-luminescence, wide viewing angle, short response time, high luminous efficiency, wide color gamut, low operating voltage, large-scale production, flexibility, and simple manufacturing process, the OLED (organic light emitting diode) display panels are widely applied.

SUMMARY

According to one aspect of the embodiments of the present disclosure, a display panel is provided. The display panel comprises a substrate and a plurality of sub-pixels located on the substrate, at least one sub-pixel of the plurality of sub-pixels comprising: a light emitting element comprising an anode and a cathode; a first transistor comprising a first active layer and a first gate which is connected to a scan line, the first active layer comprising a first electrode region, a second electrode region, and a first channel region located between the first electrode region and the second electrode region, wherein the first electrode region is connected to a data line, and the second electrode region is connected to a power line; a capacitor comprising a first electrode plate and a second electrode plate connected to the power line; a second transistor comprising a second active layer and a second gate which is connected to the first electrode plate, the second active layer comprising a third electrode region, a fourth electrode region, and a second channel region located between the third electrode region and the fourth electrode region, wherein the third electrode region is connected to the second electrode region, and the fourth electrode region is connected to the anode; and a third transistor comprising a third active layer and a third gate which is connected to a reset line, the third active layer comprising a fifth electrode region, a sixth electrode region, and a third channel region located between the fifth electrode region and the sixth electrode region, wherein the fifth electrode region is connected to the first electrode plate, and the sixth electrode region is connected to an initialization voltage line, wherein an orthographic projection of the power line on the substrate is a first projection, an orthographic projection of the reset line on the substrate is a second projection, an orthographic projection of the third channel region on the substrate is a third projection, and an orthographic projection of the data line on the substrate is a fourth projection, and wherein an region of the first projection overlapping with the second projection and the third projection is a first region, and regions of the first projection overlapping with the second projection and not overlapping with the third projection comprise a second region and a third region that are adjacent to the first region, wherein the second region is located on one side of the first region proximate to the fourth projection, and the third region is located on one side of the first region away from the fourth projection, and an area of the second region is not smaller than an area of the third region.

In some embodiments, the third projection comprises a first portion and a second portion spaced apart from each other, wherein the first portion is located within the first projection, and the second portion is located outside the first projection.

In some embodiments, the area of the second region is greater than the area of the third region.

In some embodiments, each of the first region, the second region, and the third region is in a shape of rectangle.

In some embodiments, the display panel further comprises a shielding layer, wherein: an orthographic projection of the first electrode region of the first active layer on the substrate is a fifth projection; an orthographic projection of the fifth electrode region of the third active layer on the substrate is a sixth projection; and an orthographic projection of the shielding layer on the substrate is a seventh projection, wherein the seventh projection is at least partially located between the fifth projection and the sixth projection.

In some embodiments, at least one of the fifth projection or the sixth projection at least partially overlaps with the seventh projection.

In some embodiments, at least one of the fifth projection or the sixth projection is located within the seventh projection.

In some embodiments, the first active layer and the third active layer are located in a same layer, and the shielding layer is located between the same layer and the substrate.

In some embodiments, the shielding layer comprises a metal layer.

In some embodiments, the metal layer comprises a first metal layer, a second metal layer, and a third metal located between the first metal layer and the second metal layer.

In some embodiments, a material of the first metal layer is the same as a material of the second metal layer, and different from a material of the third metal layer.

In some embodiments, the material of the first metal layer and the material of the second metal layer comprise Ti, and the material of the third metal layer comprises Al.

In some embodiments, the at least one sub-pixel further comprises at least one of: a fourth transistor comprising a fourth active layer and a fourth gate which is connected to the scan line, the fourth active layer comprising a seventh electrode region, an eighth electrode region, and a fourth channel region located between the seventh electrode region and the eighth electrode region, wherein the seventh electrode region is connected to the second gate, and the eighth electrode region is connected to the fourth electrode region; a fifth transistor comprising a fifth active layer and a fifth gate which is connected to a control line, the fifth active layer comprising a ninth electrode region, a tenth electrode region, and a fifth channel region located between the ninth electrode region and the tenth electrode region, wherein the ninth electrode region is connected to the power line, and the tenth electrode region is connected to the second electrode region; a sixth transistor comprising a sixth active layer and a sixth gate connected to the control line, the sixth active layer comprising an eleventh electrode region, a twelfth electrode region, and a sixth channel region located between the eleventh electrode region and the twelfth electrode region, wherein the eleventh electrode region is connected to the fourth electrode region, and the twelfth electrode region is connected to the anode; or a seventh transistor comprising a seventh active layer and a seventh gate which is connected to the reset line, the seventh active layer comprising a thirteenth electrode region, a fourteenth electrode region, and a seventh channel region located between the thirteenth electrode region and the fourteenth electrode region, wherein the thirteenth electrode region is connected to the twelfth electrode region, and the fourteenth electrode region is connected to the initialization voltage line.

In some embodiments, the first active layer, the second active layer, the third active layer, the fourth active layer, the fifth active layer, the sixth active layer and the seventh active layer are located in a same layer.

In some embodiments, the second electrode plate and the initialization voltage line are located in a same layer.

In some embodiments, the scan line, the first electrode plate and the reset line are located in a same layer.

In some embodiments, the data line and the power line are located in a same layer.

In some embodiments, two members of at least one group of following three groups are integrally provided: the scan line and the first gate; the first electrode plate and the second gate; or the reset line and the third gate.

According to another aspect of the embodiments of the present disclosure, a display device is provided. The display device comprises: the display panel according to any one of the above embodiments.

According to a further aspect of the embodiments of the present disclosure, a manufacturing method of a display panel is provided. The manufacturing method comprises providing a substrate and forming a plurality of sub-pixels on the substrate, at least one sub-pixel of the plurality of sub-pixels comprising: a light emitting element comprising an anode and a cathode; a first transistor comprising a first active layer and a first gate which is connected to a scan line, the first active layer comprising a first electrode region, a second electrode region, and a first channel region located between the first electrode region and the second electrode region, wherein the first electrode region is connected to a data line, and the second electrode region is connected to a power line; a capacitor comprising a first electrode plate and a second electrode plate connected to the power line; a second transistor comprising a second active layer and a second gate which is connected to the first electrode plate, the second active layer comprising a third electrode region, a fourth electrode region, and a second channel region located between the third electrode region and the fourth electrode region, wherein the third electrode region is connected to the second electrode region, and the fourth electrode region is connected to the anode; and a third transistor comprising a third active layer and a third gate which is connected to a reset line, the third active layer comprising a fifth electrode region, a sixth electrode region, and a third channel region located between the fifth electrode region and the sixth electrode region, wherein the fifth electrode region is connected to the first electrode plate, and the sixth electrode region is connected to an initialization voltage line, wherein an orthographic projection of the power line on the substrate is a first projection, an orthographic projection of the reset line on the substrate is a second projection, an orthographic projection of the third channel region on the substrate is a third projection, and an orthographic projection of the data line on the substrate is a fourth projection, and wherein an region of the first projection overlapping with the second projection and the third projection is a first region, and regions of the first projection overlapping with the second projection and not overlapping with the third projection comprise a second region and a third region that are adjacent to the first region, wherein the second region is located on one side of the first region proximate to the fourth projection, and the third region is located on one side of the first region away from the fourth projection, and an area of the second region is not smaller than an area of the third region.

BRIEF DESCRIPTION OF THE DRAWINGS

The accompanying drawings which constitute part of this specification, illustrate the exemplary embodiments of the present disclosure, and together with this specification, serve to explain the principles of the present disclosure.

The present disclosure can be more explicitly understood from the following detailed description with reference to the accompanying drawings, in which.

It should be understood that the dimensions of various parts shown in the accompanying drawings are not necessarily drawn according to actual proportional relations. In addition, the same or similar components are denoted by the same or similar reference signs.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The inventors have noted that, the crosstalk of the OLED display panel will result in degradation in the display quality of the OLED display panel. For this problem, the inventors have found after studies that: the crosstalk of the display panel can be reduced by increasing a distance between an active layer of a switching transistor connected to a data line and an active layer of an initialization transistor connected to a gate of a driving transistor.

Accordingly, the embodiments of the present disclosure propose the following technical solutions.

Figure 1:
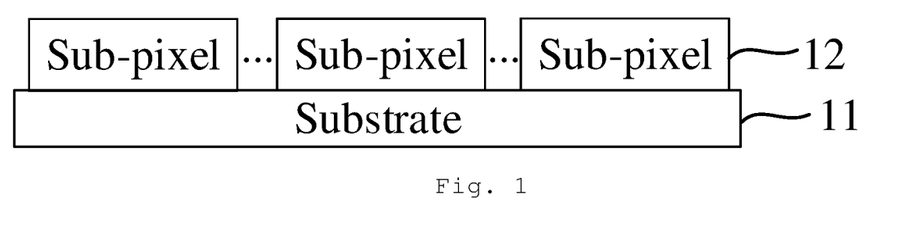
FIG. 1 is a schematic structure view showing a display panel according to an embodiment of the present disclosure.

FIG. 1 is a schematic structure view showing a display panel according to an embodiment of the present disclosure.

As shown in FIG. 1, the display panel comprises a substrate 11 and a plurality of sub-pixels 12 on the substrate 11. At least one sub-pixel 12 of the plurality of sub-pixels 12 in the display panel may comprise the structure as shown in FIG. 2.

Figure 2:
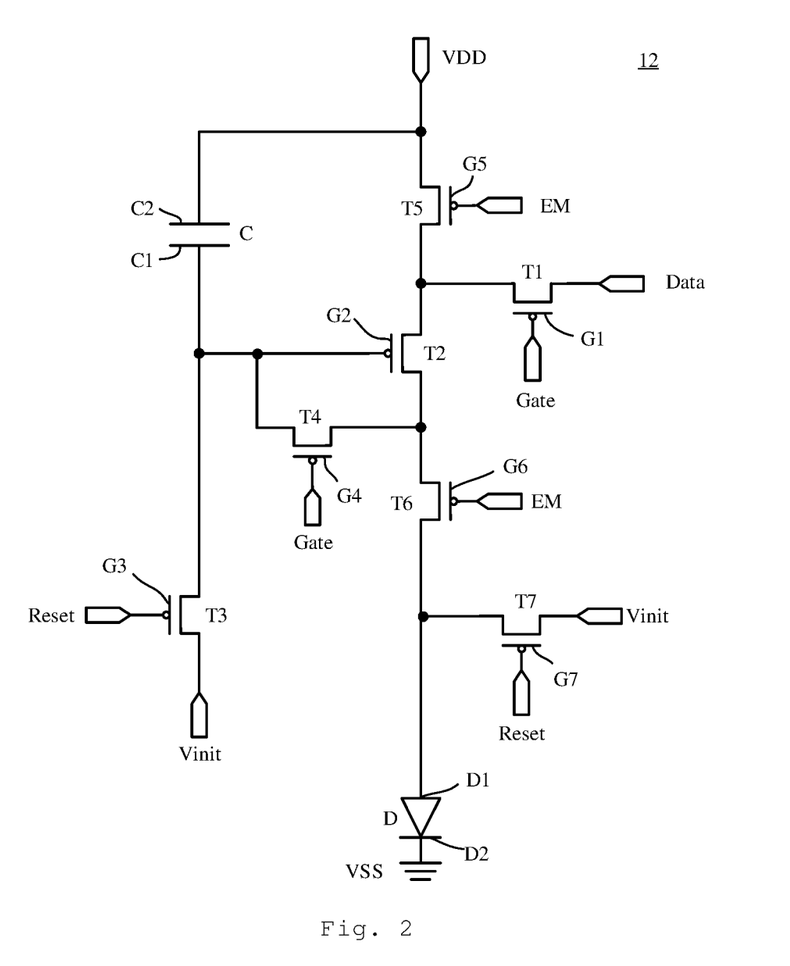
FIG. 2 is a schematic structure view showing a sub-pixel according to an embodiment of the present disclosure.
Figure 3:
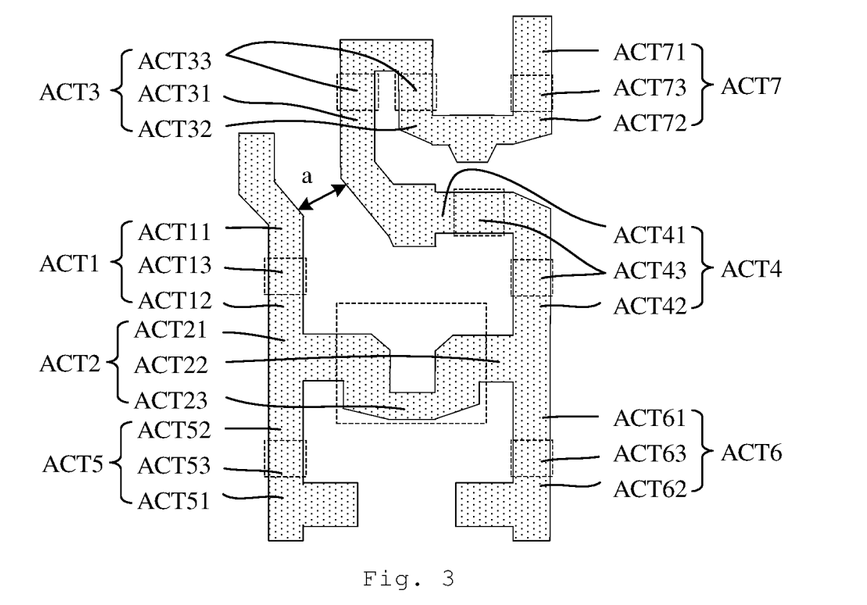
FIGS. 3 to 6 are schematic views each showing the layout of a certain layer in a sub-pixel according to some embodiments of the present disclosure.
Figure 4:
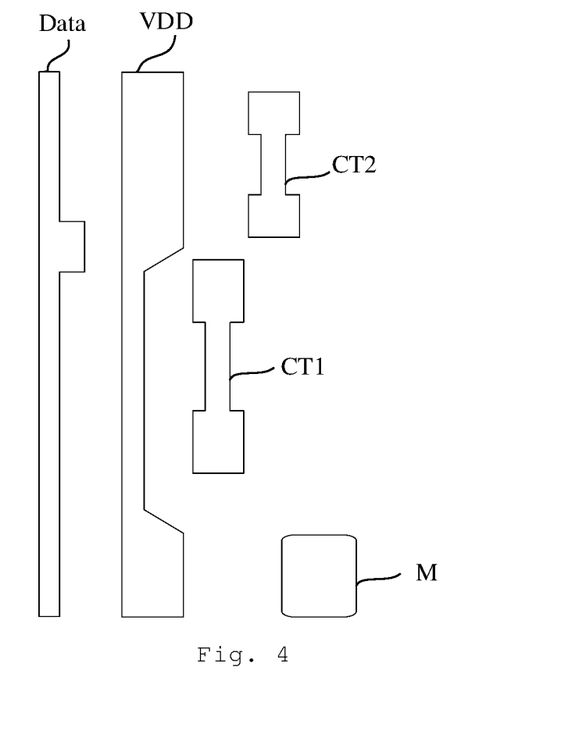
Figure 5:
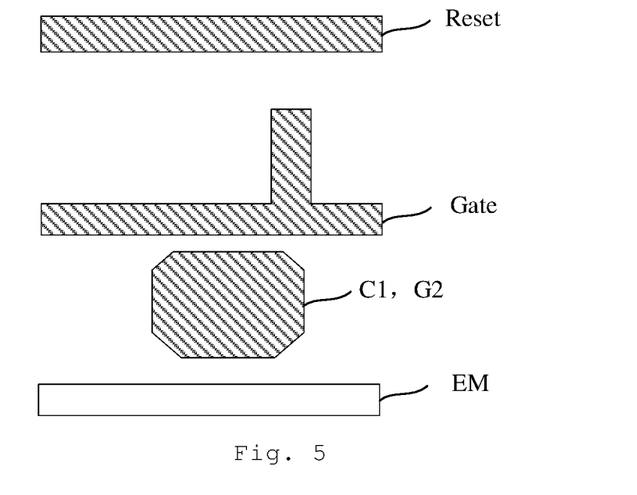
Figure 6:
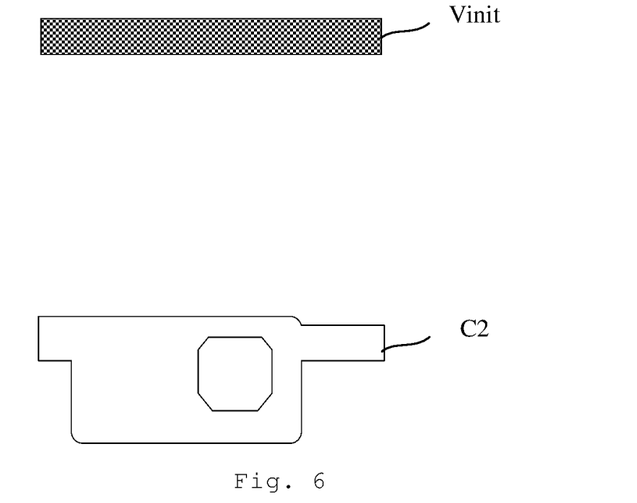
Figure 7A:
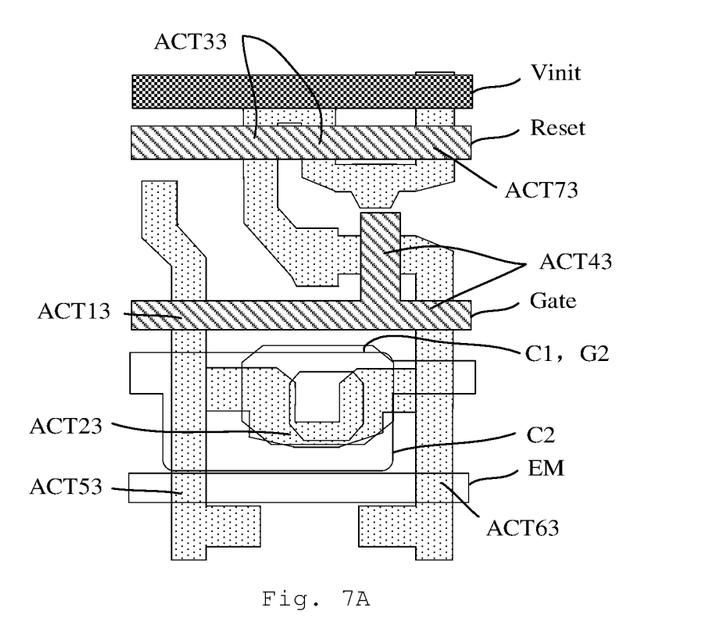
FIG. 7A is a schematic view showing the layout of stacking of layers as shown in FIGS. 3, 5, and 6 in a sub-pixel according to an embodiment of the present disclosure.
Figure 7B:
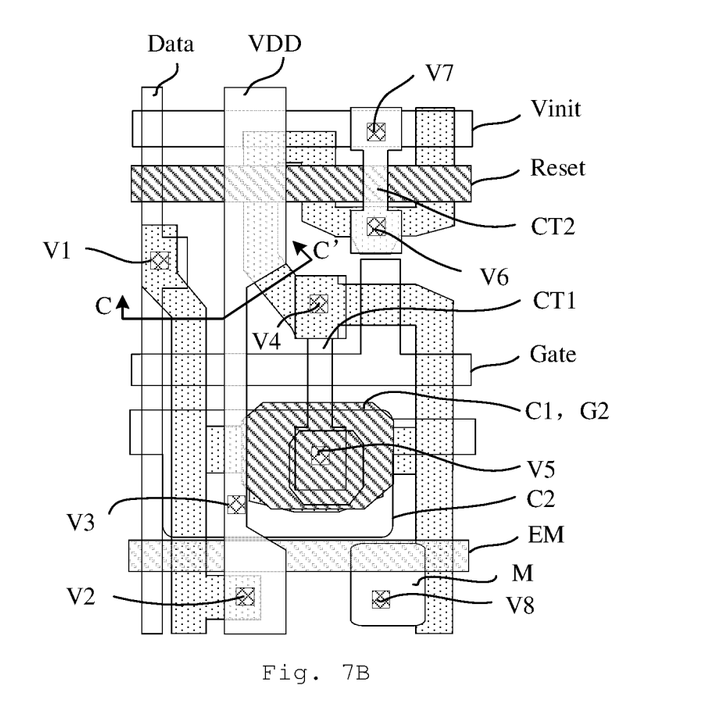
FIG. 7B is a schematic view showing the layout of stacking of layers as shown in FIG. 3 to FIG. 6 in a sub-pixel according to an embodiment of the present disclosure.

FIG. 2 is a schematic structure view showing a sub-pixel according to an embodiment of the present disclosure. FIGS. 3 to 6 are schematic views each showing the layout of a certain layer in a sub-pixel according to some embodiments of the present disclosure. FIG. 7A is a schematic view showing the layout of stacking of layers as shown in FIGS. 3, 5, and 6 in a sub-pixel according to an embodiment of the present disclosure. FIG. 7B is a schematic view showing the layout of stacking of layers as shown in FIG. 3 to FIG. 6 in a sub-pixel according to an embodiment of the present disclosure.

As shown in FIG. 2, the sub-pixel 12 may comprise a light emitting element D, a first transistor T1, a capacitor C, a second transistor T2, and a third transistor T3. The light emitting element D comprises an anode D1 and a cathode D2. In some implementations, the light emitting element D may be an OLED. Here, the first transistor T1 may also be referred to as a switching transistor, the second transistor T2 may also be referred to as a driving transistor, and the third transistor T3 may also be referred to as a reset transistor.

The first transistor T1 is configured to, in a case where the first transistor T1 is turned on in response to a scan signal of the scan line Gate, transmit a data signal from the data line Data to the second transistor T2. The second transistor T2 is configured to, in a case where the second transistor T2 is turned on, transmit a driving current Id to the light emitting element D to drive the light emitting element D to emit light. The third transistor T3 is configured to, in a case where the third transistor T3 is turned on in response to a reset signal of the reset line Reset, reset a voltage of the gate G2 of the second transistor T2 to a voltage of the initialization voltage line Vinit.

In different embodiments, as shown in FIG. 2, the sub-pixel 12 may further comprise one or more of a fourth transistor T4, a fifth transistor T5, a sixth transistor T6, and a seventh transistor T7. Here, the fourth transistor T4 may also be referred to as a compensation transistor, the fifth transistor T5 may also be referred to as a drive control transistor, the sixth transistor T6 may also be referred to as an emission control transistor, and the seventh transistor T7 may also be referred to as a bypass transistor. For example, the fourth transistor T4 is configured, in a case where the fourth transistor T4 is turned on in response to a scan signal of the scan line Gate, such that the second transistor T2 to be in a diode connection state. For example, the fifth transistor T5 and the sixth transistor T6 are configured, in a case where the fifth transistor T5 is turned on in response to a control signal of the control line EM, such that the emission current Id flows to the light emitting element D. For example, the seventh transistor T7 is configured, in a case where the seventh transistor T7 is turned on in response to a reset signal of the reset line Reset, such that a part of the driving current Id flows the seventh transistor T7 as a bypass current Ibp. It should be noted that, although the third gate G3 of the third transistor T3 and the seventh gate G7 of the seventh transistor T7 shown in FIG. 2 are both connected to the same reset line Reset, this is not restrictive. For example, in some embodiments, the seventh gate G7 of the seventh transistor T7 may be connected to another reset line different from the reset line Reset.

In some embodiments, the first transistor T1, the second transistor T2, the third transistor T3, the fourth transistor T4, the fifth transistor T5, the sixth transistor T6, and the seventh transistor T7 each is a P-channel thin film transistors. In other embodiments, one or more of the first transistor T1, the second transistor T2, the third transistor T3, the fourth transistor T4, the fifth transistor T5, the sixth transistor T6, and the seventh transistor T7 may be N-channel thin film transistors.

For example, the active layer of each of the first transistor T1, the second transistor T2, the third transistor T3, the fourth transistor T4, the fifth transistor T5, the sixth transistor T6, and the seventh transistor T7 may be as shown in FIG. 3. The material of the active layer may comprise, for example, polysilicon, for example low-temperature polysilicon or the like. The active layer of each transistor comprises two electrode regions and a channel region located between the two electrode regions. Here, one of the two electrode regions is a source region, and the other is a drain region. It should be understood that, the doping concentration in the two electrode regions is greater than that in the channel region. In other words, each of the two electrode regions is a conductor region, and the channel region is a semiconductor region.

Referring to FIGS. 2 and 3, the first transistor T1 comprises a first active layer ACT1, and a first gate G1 which is connected to the scan line Gate. In some embodiments, the scan line Gate and the first gate G1 may be integrally provided. As shown in FIG. 3, the first active layer ACT1 comprises a first electrode region ACT11, a second electrode region ACT12, and a first channel region ACT13 located between the first electrode region and the second electrode region. Here, the first electrode region ACT11 is connected to the data line Data, and the second electrode region ACT12 is connected to the power line VDD. For example, the first electrode region ACT11 may be connected to the data line Data via a via hole V1 shown in FIG. 7B. In some embodiments, the second electrode region ACT12 may be connected to the power line VDD via a fifth active layer ACT5 of the fifth transistor T5. For example, the fifth active layer ACT5 may be connected to the power line VDD via a via hole V2 shown in FIG. 7B. In some embodiments, referring to FIG. 4, the data line Data and the power line VDD may be located in a same layer.

It should be noted that, in this disclosure, the expression that two components are located in a same layer means that the two components are formed by a same patterning process, that is, formed by patterning a same material layer; or, the two components are located on a same film layer and in direct contact with the same film layer.

The capacitor C comprises a first electrode plate C1, and a second electrode plate C2 connected to the power line VDD. For example, the second electrode plate C2 may be connected to the power line VDD via a via hole V3 shown in FIG. 7B.

The second transistor T2 comprises a second active layer ACT2, and a second gate G2 which is connected to the first electrode plate C1. In some embodiments, the first electrode plate C1 and the second gate G2 may be integrally provided. As shown in FIG. 3, the second active layer ACT2 comprises a third electrode region ACT21, a fourth electrode region ACT22, and a second channel region ACT23 located between the third electrode region ACT21 and the fourth electrode region ACT22. The third electrode region ACT21 is connected to the second electrode region ACT12, and the fourth electrode region ACT22 is connected to the anode D1. In some embodiments, the third electrode region ACT21 and the second electrode region ACT12 may be integrally provided. In some embodiments, the third electrode region ACT21 may be connected to the power line VDD via a fifth active layer ACT5 of the fifth transistor T5.

The third transistor T3 comprises a third active layer ACT3, and a third gate G3 which is connected to the reset line Reset. In some embodiments, the reset line Reset and the third gate G3 may be integrally provided. As shown in FIG. 3, the third active layer ACT3 comprises a fifth electrode region ACT31, a sixth electrode region ACT32, and a third channel region ACT33 located between the fifth electrode region ACT31 and the sixth electrode region ACT32. The fifth electrode region ACT31 is connected to the first electrode plate C1, and the sixth electrode region ACT32 is connected to the initialization voltage line Vinit. For example, the fifth electrode region ACT31 may be connected to the first connector CT1 via a via hole V4 shown in FIG. 7B, and the first electrode plate C1 may be connected to a first connector CT1 via a via hole V5 shown in FIG. 7B. For example, the sixth electrode region ACT32 may be connected to a second connector CT2 via a via hole V6 shown in FIG. 7B, and the initialization voltage line Vinit may be connected to the second connector CT2 via a via hole V7 shown in FIG. 7B. In some embodiments, referring to FIG. 4, the first connector CT1, the second connector CT2, the data line Data, and the power line VDD may be located in a same layer. In some embodiments, referring to FIG. 5, the scan line Gate, the first electrode plate C1, and the reset line Reset may be located in a same layer. In some embodiments, referring to FIG. 6, the second electrode plate C2 and the initialization voltage line Vinit may be located in a same layer.

Referring to FIGS. 3 and 7A, the first channel region ACT13 may be a region of the first active layer ACT1 overlapping with the scan line Gate, the second channel region ACT23 may be a region of the second active layer ACT2 overlapping with the first electrode plate C1, the third channel region ACT33 may be a region of the third active layer ACT3 overlapping with the reset line Reset, and the fourth channel region ACT43 may be a region of the fourth active layer ACT4 overlapping with the scan line Gate.

Figure 8A:
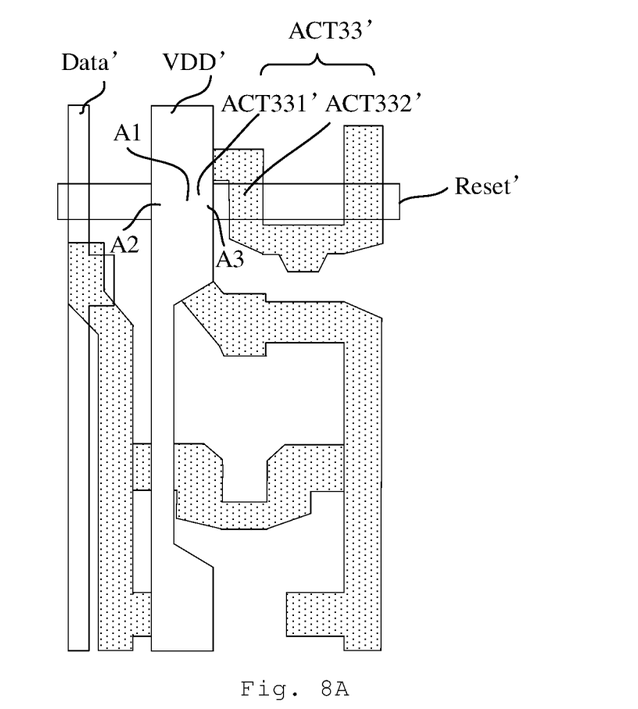
FIG. 8A is a schematic view showing the projections of some layers of a plurality of layers in a sub-pixel on a substrate according to an embodiment of the present disclosure.

FIG. 8A is a schematic view showing the projections of some layers of a plurality of layers in a sub-pixel on a substrate according to an embodiment of the present disclosure. It should be noted that, in order to clearly show the positional relationships between the power line VDD, the reset line Reset, the data line Data and the third active layer ACT3, other components in some layers are omitted in FIG. 8A.

As shown in FIG. 8A, the orthographic projection of the power line VDD on the substrate 11 is the first projection VDD', the orthographic projection of the reset line Reset on the substrate 11 is the second projection Reset', and the orthographic projection of the third channel region ACT33 of the third transistor T3 on the substrate 11 is the third projection ACT33', and the orthographic projection of the data line Data on the substrate 11 is the fourth projection Data'. In some embodiments, the third projection ACT33' may comprise a first portion ACT331' and a second portion ACT332' that are spaced apart. The first portion ACT331' is located within the first projection VDD', and the second portion ACT332' is located outside the first projection VDD'. In other words, the third gate G3 of the third transistor T3 comprises two gates, the orthographic projection of one gate on the substrate 11 completely overlaps with the first portion ACT331', and the orthographic projection of the other gate on the substrate 11 completely overlaps with the second portion ACT332'.

The region of the first projection VDD' overlapping with the second projection Reset' and the third projection ACT33' is the first region A1, and areas of the first projection VDD' overlapping with the second projection Reset' and not overlapping with the third projection ACT33' comprise a second region A2 and a third region A3 that are both adjacent to the first region A1. The second region A2 is located on one side of the first region A1 proximate to the fourth projection Data', and the third region A3 is located on one side of the first region A1 away from the fourth projection Data'. As some implementations, each of the first region A1, the second region A2, and the third region A3 may be in a shape of rectangle. It should be understood that, the rectangle here refers to a rectangle within a deviation range of the process, that is, substantially a rectangle. It should also be understood that, the present disclosure is not limited to this.

Figure 8B:
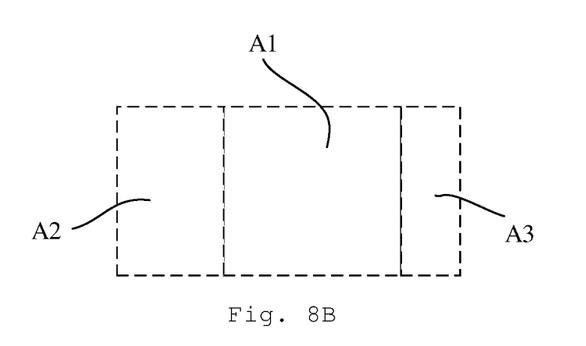
FIG. 8B is an enlarged schematic view showing the first region A1, the second region A2, and the third region A3 as shown in FIG. 8A.

FIG. 8B is an enlarged schematic view showing the first region A1, the second region A2, and the third region A3 as shown in FIG. 8A.

In FIGS. 8A and 8B, the area of the second region A2 is not smaller than the area of the third region A3. For example, the area of the second region A2 is equal to the area of the third region A3. For another example, the area of the second region A2 is greater than the area of the third region A3.

In the above embodiments, since the area of the second region A2 is not smaller than that of the third region A3, the distance between the first electrode region ACT11 of the first active layer ACT1 and the fifth electrode region ACT31 of the third active layer ACT3 is increased, thereby reducing the capacitance between the first electrode region ACT11 and the fifth electrode region ACT31, and reducing the crosstalk of the display panel.

As shown in FIG. 3, the distance between the first electrode region ACT11 and the fifth electrode region ACT31 may be presented as distance a. By way of simulation experiments, the crosstalk corresponding to different distances a can be obtained.

The correspondence between several typical values of distance a and the crosstalk is shown in the following table. In addition, c1 and c2 corresponding to different distances a are also shown in the following table. Here, c1 represents the capacitance between the first electrode region ACT11 and the fifth electrode region ACT31 within a same sub-pixel, and c2 represents the capacitance between the first electrode region ACT11 within one sub-pixel 12 and the fifth electrode region ACT31 within another sub-pixel 12.

| a/micrometer | 2.74 | 3.26 | 3.83 |
| --- | --- | --- | --- |
| c1/fF | 0.0793 | 0.0713 | 0.0561 |
| c2/fF | 0.0281 | 0.0287 | 0.0279 |
| crosstalk | 0.808% | 0.762% | 0.665% |

As may be seen from the above table, as distance a increases, c1 gradually decreases, and the crosstalk also gradually decreases. In some embodiments, the range of distance a may be 2.5 microns to 5 microns, for example, 2.74 microns, 3.26 microns, 3.58 microns, 3.83 microns, etc. In some embodiments, in order to balance the resolution of the display panel and the crosstalk of the display panel, distance a may be 3.26 microns. The width of the data line Data may be, for example, 2 micrometers to 3 micrometers, for example about 2.5 micrometers.

It should be understood that, the proportion value in the above table can reflect the greatness of crosstalk. For example, the crosstalk can be measured by the greatness of Ib/Ia. Ia is a current flowing through the light emitting element in a certain sub-pixel when a white screen is displayed by the display panel. Ib is a current flowing through the light emitting element in the above certain sub-pixel when a black screen is displayed in a part of the region (for example, a certain rectangular area) of the display panel adjacent to the sub-pixel, and a white screen is displayed in other regions of the display panel. It should be noted that, in different embodiments, different parameters may be used to reflect the crosstalk of the display panel.

Figure 8C:
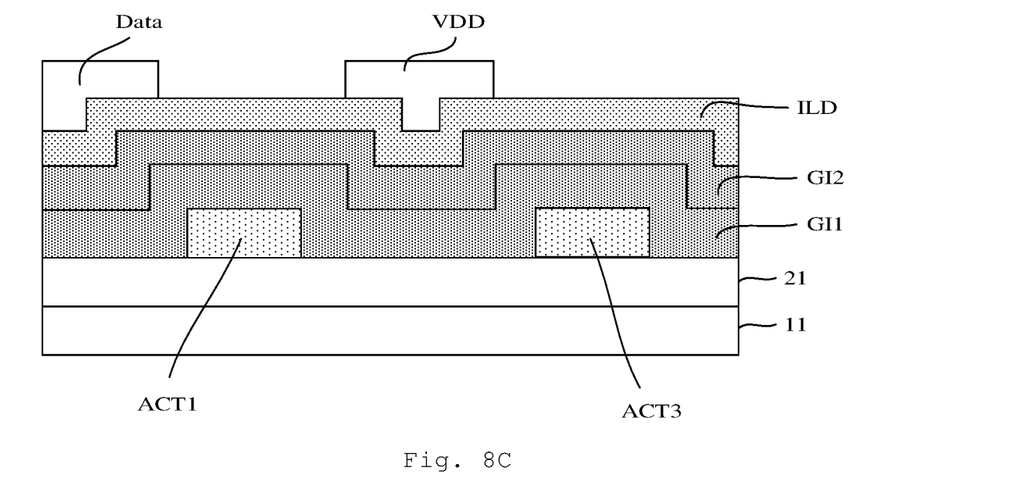
FIG. 8C is a schematic cross-sectional view taken along C-C' as shown in FIG. 7B.

FIG. 8C is a schematic cross-sectional view taken along C-C' as shown in FIG. 7B.

As shown in FIG. 8C, a buffer layer 21, for example an inorganic layer such as silicon oxide and silicon nitride may be on the substrate 11. The first active layer ACT1 and the third active layer ACT3 spaced apart from each other are on the buffer layer 21. The first insulating layer GI1 covers the first active layer ACT1 and the third active layer ACT3. The second insulating layer GI1 is located on the first insulating layer GI1. The interlayer insulating layer ILD is on the second insulating layer GI1. The data line Data and the power line VDD spaced apart from each other are on the interlayer insulating layer ILD. The materials of the first insulating layer GI1 and the second insulating layer GI1 may comprise silicon oxide or the like.

During the process of forming the sub-pixel 12, the positions of the first active layer ACT1 and the third active layer ACT3 may be adjusted to reduce the distance between the first electrode region ACT11 in the first active layer ACT1 and the fifth electrode region ACT31 in the third active layer ACT3, thereby reducing the crosstalk of the display panel.

In some embodiments, in order to further reduce the crosstalk of the display panel, the display panel may further comprise a shielding layer.

Figure 9A:
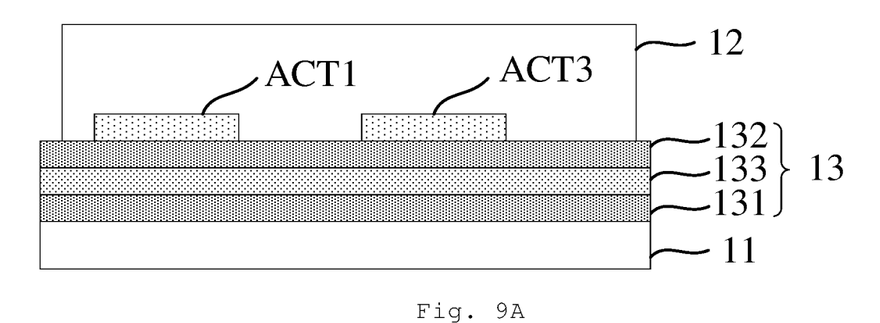
FIG. 9A is a schematic structure view showing a display panel according to another embodiment of the present disclosure.

FIG. 9A is a schematic structure view showing a display panel according to another embodiment of the present disclosure.

It should be noted that, FIG. 9A only shows the first active layer ACT1 and the third active layer ACT3 in one sub-pixel 12 in a simplified manner and does not show other active layers.

As shown in FIG. 9A, the display panel further comprises a shielding layer 13. In these embodiments, the first active layer ACT1 of the first transistor T1 and the third active layer ACT3 of the third transistor T3 are located in a same layer. FIG. 9A schematically shows the shielding layer 13 to be located between the same layer in which the first active layer ACT1 and the third active layer ACT3 are located and the substrate 11. It should be understood that, in other implementations, the shielding layer 13 may also be located on one side, that is, an upper side, of the same layer in which the first active layer ACT1 and the third active layer ACT3 are located away from the substrate 11.

Figure 9B:
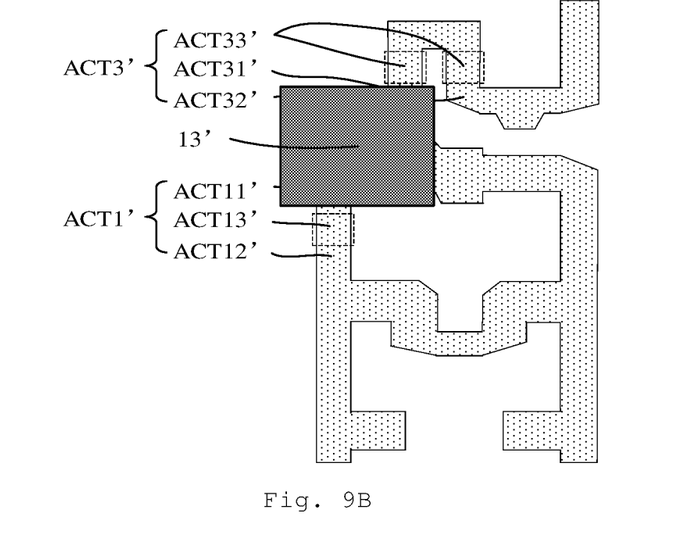
FIG. 9B is a schematic view showing the projections of some layers of a plurality of layers in a sub-pixel on a substrate according to another embodiment of the present disclosure.

FIG. 9B is a schematic view showing the projections of some layers of a plurality of layers in a sub-pixel on a substrate according to another embodiment of the present disclosure. The positional relationships between the shielding layer 13 and other layers will be described below in conjunction with FIG. 9B.

It may be understood that, in order to clearly show the positional relationships between the first active layer ACT1, the third active layer ACT3, and the shielding layer 13, FIG. 9B only shows the numerals of the orthographic projections of the first active layer ACT1, the third active layer ACT3 and the shielding layer 13 on the substrate 11.

The orthographic projection of the first active layer ACT1 on the substrate 11 is a projection ACT1', the orthographic projection of the first electrode region ACT11 of the first active layer ACT1 on the substrate 11 is a projection ACT11', the orthographic projection of the second electrode region ACT12 of the first active layer ACT1 on the substrate 11 is a projection ACT12', and the orthographic projection of the first channel region ACT13 of the first active layer ACT1 on the substrate 11 is a projection ACT13'.

The orthographic projection of the third active layer ACT3 on the substrate 11 is a projection ACT3', the orthographic projection of the fifth electrode region ACT31 of the third active layer ACT3 on the substrate 11 is a projection ACT31', the orthographic projection of the six-electrode region ACT32 of the third active layer ACT3 on the substrate 11 is a projection ACT32', and the orthographic projection of the third channel region ACT33 of the third active layer ACT3 on the substrate 11 is a projection ACT33'.

In order to make a distinction, the orthographic projection of the first electrode region ACT11 on the substrate 11 is referred to as a fifth projection ACT11', the orthographic projection of the fifth electrode region ACT31 on the substrate 11 is referred to as a sixth projection ACT31', and the orthographic projection on 11 of the shielding layer 13 on the substrate 11 is referred to as a seventh projection 13'.

The seventh projection 13' is at least partially located between the fifth projection ACT11' and the sixth projection ACT31'. For example, as shown in FIG. 9B, the seventh projection 13' may be partially located between the fifth projection ACT11' and the sixth projection ACT31'. For another example, the seventh projection 13' may be completely located between the fifth projection ACT11' and the sixth projection ACT31'.

In the above embodiments, with the presence of the shielding layer 13, the capacitance between the first electrode region ACT31 and the fifth electrode region ACT32 can be further reduced, thereby further reducing the crosstalk of the display panel.

In some embodiments, the shielding layer 13 comprises a metal layer. As some implementations, the material of the metal layer may comprise Mo.

As other implementations, in order to more effectively reduce the capacitance between the first electrode region ACT31 and the fifth electrode region ACT32, referring to FIG. 9A, the metal layer may comprise a first metal layer 131, a second metal layer 132, and a third metal layer 133 located between the first metal layer 131 and the second metal layer 132. For example, the material of the first metal layer 131 is the same as the material of the second metal layer 132, and different from the material of the third metal layer 133 are. As some examples, the materials of the first metal layer 1311 and the second metal layer 32 may comprise Ti, and the material of the third metal layer 133 may comprise Al.

In some embodiments, in order to further reduce the capacitance between the first electrode region ACT31 and the fifth electrode region 42, so as to further reduce the crosstalk of the display panel, at least one of the fifth projection ACT11' or the sixth projection ACT31' may at least partially overlap with the seventh projection 13'. For example, the fifth projection ACT11' partially overlaps with the seventh projection 13', and the sixth projection ACT31' does not overlap the seventh projection 13'. For another example, the fifth projection ACT11' partially overlaps with the seventh projection 13', and the sixth projection ACT31' partially overlaps with the seventh projection 13'.

In some embodiments, in order to further reduce the capacitance between the first electrode region ACT31 and the fifth electrode region 42, so as to further reduce the crosstalk of the display panel, at least one of the fifth projection ACT1' or the sixth projection ACT3' may be located within the seventh projection 13'. For example, one of the fifth projection ACT1' and the sixth projection ACT3' is located within the seventh projection 13', and the other is not located within the seventh projection 13'. For another example, the fifth projection ACT1' and the sixth projection ACT3' are both located within the seventh projection 13'.

As described above, among the plurality of sub-pixels of the display panel according to the embodiments of the present disclosure, at least one sub-pixel 12 may further comprise one or more of the fourth transistor T4, the fifth transistor T5, the sixth transistor T6, and the seventh transistor T7.

The fourth transistor T4, the fifth transistor T5, the sixth transistor T6, and the seventh transistor T7 will be introduced below in conjunction with FIGS. 2 and 3.

The fourth transistor T4 comprises a fourth active layer ACT4, and a fourth gate G4 which is connected to the scan line Gate. In some embodiments, the scan line Gate and the fourth gate G4 may be integrally provided. As shown in FIG. 3, the fourth active layer ACT4 comprises a seventh electrode region ACT41, an eighth electrode region ACT42, and a fourth channel region ACT43 located between the seventh electrode region ACT41 and the eighth electrode region ACT42. The seventh electrode region ACT41 is connected to the second gate G2, and the eighth electrode region ACT42 is connected to the fourth electrode region ACT22. For example, the seventh electrode region ACT41 may be connected to the first connector CT1 via the via hole V4 shown in FIG. 7B, and the second gate G2 may be connected to the first connector CT1 via the via hole V5 shown in FIG. 7B. In some embodiments, the seventh electrode region ACT41 and the fifth electrode region ACT31 may be integrally provided. In some embodiments, the eighth electrode region ACT42 and the fourth electrode region ACT22 may be integrally provided. In some embodiments, the fourth channel region ACT43 may comprise two portions spaced apart, that is, the fourth gate G4 may comprise two gates.

The fifth transistor T5 comprises a fifth active layer ACT5, and a fifth gate G5 which is connected to a control line EM. As shown in FIG. 3, the fifth active layer ACT5 comprises a ninth electrode region ACT51, a tenth electrode region ACT52, and a fifth channel region ACT53 located between the ninth electrode region ACT51 and the tenth electrode region ACT52. The ninth electrode region ACT51 is connected to the power line VDD, and the tenth electrode region ACT52 is connected to the second electrode region ACT12. For example, the ninth electrode region ACT51 may be connected to the power line VDD via the via hole V2 shown in FIG. 7B. For example, the tenth electrode region ACT52 may be connected to the second electrode region ACT12 via the third electrode region ACT21. In some embodiments, referring to FIG. 5, the control line EM, the scan line Gate, the first electrode plate C1, and the reset line Reset may be located in a same layer.

The sixth transistor T6 comprises a sixth active layer ACT6, and a sixth gate G6 which is connected to the control line EM. As shown in FIG. 3, the sixth active layer ACT6 comprises an eleventh electrode region ACT61, a twelfth electrode region ACT62, and a sixth channel region ACT63 located between the eleventh electrode region ACT61 and the twelfth electrode region ACT62. The eleventh electrode region ACT61 is connected to the fourth electrode region ACT22, and the twelfth electrode region ACT62 is connected to the anode D1. In some embodiments, the eleventh electrode region ACT61 and the fourth electrode region ACT22 may be integrally provided. In some embodiments, the twelfth electrode region ACT62 may be connected to a conductive layer M (for example, a metal layer) via a via hole V8 shown in FIG. 7B, and the conductive layer M may be connected to the anode D1 via another via hole. In some embodiments, referring to FIG. 4, the conductive layer M, the first connector CT1, the second connector CT2, the data line Data, and the power line VDD may be located in a same layer.

The seventh transistor T7 comprises a seventh active layer ACT7, and a seventh gate G7 which is connected to the reset line Reset. In some embodiments, the reset line Reset and the seventh gate G7 may be integrally provided. As shown in FIG. 3, the seventh active layer ACT7 comprises a thirteenth electrode region ACT71, a fourteenth electrode region ACT72, and a seventh channel region ACT73 located between the thirteenth electrode region ACT71 and the fourteenth electrode region ACT72. The thirteenth electrode region ACT71 is connected to the twelfth electrode region ACT62, and the fourteenth electrode region ACT72 is connected to the initialization voltage line Vinit. For example, the fourteenth electrode region ACT72 may be connected to the second connector CT2 via the via hole V6 shown in FIG. 7B, and the initialization voltage line Vinit may be connected to the second connector CT2 via the via hole V7 shown in FIG. 7B. In some embodiments, the fourteenth electrode region ACT72 and the sixth electrode region ACT32 may be integrally provided.

Referring to FIGS. 3 and 7A, the fifth channel region ACT53 may be a region of the fifth active layer ACT5 overlapping with the control line EM, the sixth channel region ACT63 may be a region of the sixth active layer ACT6 overlapping with the control line EM, the seventh channel region ACT73 may be a region of the seventh active layer ACT7 overlaps with the reset line.

In some embodiments, referring to FIG. 3, the first active layer ACT1, the second active layer ACT2, the third active layer ACT3, the fourth active layer ACT4, the fifth active layer ACT5, and the sixth active layer ACT6 and the seventh active layer ACT7 may be located in a same layer.

The driving method of the sub-pixel according to some embodiments of the present disclosure will be introduced below. It should be noted that, in the following description, it is supposed that a sub-pixel comprises transistors T1, T2, T3, T4, T5, T6, and T7 which are all P-type channel transistors.

In a reset phase, the third transistor T3 is turned on in response to the reset signal of the reset line Reset, and the second gate G2 of the second transistor T2 is connected to the initialization voltage line Vinit via the third transistor T3. In this way, the voltage of the second gate G2 of the driving transistor T1 is reset to the voltage of the initialization voltage line Vinit.

In a compensation phase, the first transistor T1 and the fourth transistor T4 are turned on in response to the scan signal of the scan line Gate. In this case, the second transistor T2 is in a diode connection state and forwardly biased. The voltage of the second gate G2 of the second transistor T2 is a sum of the voltage Vdata of the data signal from the data line Data and the threshold voltage Vth (negative number) of the second transistor T2, that is, Vdata+Vth. At this time, the voltage of the first electrode plate C1 of the capacitor Cst is Vdata+Vth, and the voltage of the second electrode plate C2 of the capacitor Cst is the voltage ELVDD of the power line VDD. The capacitor Cst is charged with an electric charge corresponding to a voltage difference between the first electrode plate C1 and the second electrode plate C2.

In a light emitting phase, the fifth transistor T5 and the sixth transistor T6 are turned on in response to the control signal of the control line EM. The driving current Id is generated in response to a voltage difference between the voltage of the second gate G2 of the second transistor T2 and the voltage of the power line VDD, and supplied to the light emitting element D through the sixth transistor T6. In the light emitting phase, the gate-source voltage Vgs of the second transistor T2 is maintained at (Vdata+Vth)−ELVDD. The drive current Id is proportional to (Vdata−ELVDD)2.

Therefore, the driving current Id is independent of the threshold voltage Vth of the first transistor T1.

In addition, in the reset phase, the seventh transistor T7 is turned on in response to the reset signal of the reset line Reset. In addition, the seventh transistor T7 may be turned on simultaneously with the first transistor T1 and the fourth transistor T4. In order to avoid that the driving current Id drives the light emitting element D to emit light in a case where the second transistor T2 is turned off, a part of the driving current Id may be flow out through the seventh transistor T7 as a bypass current Ibp.

The present disclosure also provides a display device, which may comprise the display panel according to any one of the above embodiments. In some embodiments, the display device may be, for example, any product or component with a display function, such as a mobile terminal, a television, a monitor, a notebook computer, a digital photo frame, a navigator, or an electronic paper.

The embodiments of the present disclosure also provide a manufacturing method of a display panel. The manufacturing method of the display panel comprises providing a substrate; and forming a plurality of sub-pixels on the substrate. Referring to FIG. 2, the structure of at least one sub-pixel comprises a light emitting element D, a first transistor T1, a capacitor C, a second transistor T2, and a third transistor T3.

Referring to FIGS. 2 and 3, the light emitting element D comprises an anode D1 and a cathode D2. The first transistor T1 comprises a first active layer ACT1, and a first gate G1 which is connected to the scan line Gate. The first active layer ACT1 comprises a first electrode region ACT11, a second electrode region ACT12, and a first channel region ACT13 located between the first electrode region and the second electrode region. The first electrode region ACT11 is connected to the data line Data, and the second electrode region ACT12 is connected to the power line VDD.

The capacitor C comprises a first electrode plate C1, and a second electrode plate C2 which is connected to the power line VDD. The second transistor T2 comprises a second active layer ACT2, and a second gate G2 which is connected to the first electrode plate C1. The second active layer ACT2 comprises a third electrode region ACT21, a fourth electrode region ACT22, and a second channel region ACT23 located between the third region ACT21 and the fourth electrode region ACT22. The third electrode region ACT21 is connected to the second electrode region ACT12, and the fourth electrode region ACT22 is connected to the anode D1.

The third transistor T3 comprises a third active layer ACT3, and a third gate G3 which is connected to the reset line Reset. The third active layer ACT3 comprises a fifth electrode region ACT31, a sixth electrode region ACT32, and a third channel region ACT33 located between the fifth electrode region ACT31 and the sixth electrode region ACT32. The fifth electrode region ACT31 is connected to the first electrode plate C1, and the sixth electrode region ACT32 is connected to the initialization voltage line Vinit.

As shown in FIG. 8A, the orthographic projection of the power line VDD on the substrate 11 is the first projection VDD', the orthographic projection of the reset line Reset on the substrate 11 is the second projection Reset', the orthographic projection of the third channel region ACT33 of the third transistor T3 on the substrate 11 is the third projection ACT33', and the orthographic projection of the data line Data on the substrate 11 is the fourth projection Data'. The region of the first projection VDD' overlapping with the second projection Reset' and the third projection ACT33' is the first region A1, and regions of the first projection VDD' overlapping with the second projection Reset' and not overlapping with the third projection ACT33' comprise a second region A2 and a third region A3 that are both adjacent to the first region A1. The second region A2 is located on one side of the first region A1 proximate to the fourth projection Data', and the third region A3 is located on one side of the first region A1 away from the fourth projection Data'. The area of the second region A2 is not smaller than that of the third region A3.

In the display panel formed in the above embodiments, since the area of the second region A2 is not smaller than that of the third region A3, the distance between the first electrode region ACT11 of the first active layer ACT1 and the fifth electrode region ACT31 of the third active layer ACT3 is increased, thereby reducing the capacitance between the first electrode region ACT11 and the fifth electrode region ACT31, and reducing the crosstalk of the display panel.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A display panel, comprising a substrate and a plurality of sub-pixels located on the substrate, at least one sub-pixel of the plurality of sub-pixels comprising:
    a light emitting element comprising an anode and a cathode;
    a first transistor comprising a first active layer and a first gate which is connected to a scan line, the first active layer comprising a first electrode region, a second electrode region, and a first channel region located between the first electrode region and the second electrode region, wherein the first electrode region is connected to a data line, and the second electrode region is connected to a power line;
    a capacitor comprising a first electrode plate and a second electrode plate connected to the power line;
    a second transistor comprising a second active layer and a second gate which is connected to the first electrode plate, the second active layer comprising a third electrode region, a fourth electrode region, and a second channel region located between the third electrode region and the fourth electrode region, wherein the third electrode region is connected to the second electrode region, and the fourth electrode region is connected to the anode; and
    a third transistor comprising a third active layer and a third gate which is connected to a reset line, the third active layer comprising a fifth electrode region, a sixth electrode region, and a third channel region located between the fifth electrode region and the sixth electrode region, wherein the fifth electrode region is connected to the first electrode plate, and the sixth electrode region is connected to an initialization voltage line,
    wherein an orthographic projection of the power line on the substrate is a first projection, an orthographic projection of the reset line on the substrate is a second projection, an orthographic projection of the third channel region on the substrate is a third projection, and an orthographic projection of the data line on the substrate is a fourth projection, and
    wherein an region of the first projection overlapping with the second projection and the third projection is a first region, and regions of the first projection overlapping with the second projection and not overlapping with the third projection comprise a second region and a third region that are adjacent to the first region, wherein the second region is located on one side of the first region proximate to the fourth projection, and the third region is located on one side of the first region away from the fourth projection, and an area of the second region is not smaller than an area of the third region.

2. The display panel according to claim 1, wherein the third projection comprises a first portion and a second portion spaced apart from each other, wherein the first portion is located within the first projection, and the second portion is located outside the first projection.

3. The display panel according to claim 1, wherein the area of the second region is greater than the area of the third region.

4. The display panel according to claim 1, wherein each of the first region, the second region, and the third region is in a shape of rectangle.

5. The display panel according to claim 1, further comprising a shielding layer, wherein:
    an orthographic projection of the first electrode region of the first active layer on the substrate is a fifth projection;
    an orthographic projection of the fifth electrode region of the third active layer on the substrate is a sixth projection; and
    an orthographic projection of the shielding layer on the substrate is a seventh projection, wherein the seventh projection is at least partially located between the fifth projection and the sixth projection.

6. The display panel according to claim 5, wherein at least one of the fifth projection or the sixth projection at least partially overlaps with the seventh projection.

7. The display panel according to claim 6, wherein at least one of the fifth projection or the sixth projection is located within the seventh projection.

8. The display panel according to claim 5, wherein the first active layer and the third active layer are located in a same layer, and the shielding layer is located between the same layer and the substrate.

9. The display panel according to claim 5, wherein the shielding layer comprises a metal layer.

10. The display panel according to claim 9, wherein the metal layer comprises a first metal layer, a second metal layer, and a third metal located between the first metal layer and the second metal layer.

11. The display panel according to claim 10, wherein a material of the first metal layer is the same as a material of the second metal layer, and different from a material of the third metal layer.

12. The display panel according to claim 11, wherein the material of the first metal layer and the material of the second metal layer comprise Ti, and the material of the third metal layer comprises Al.

13. The display panel according to claim 1, wherein the at least one sub-pixel further comprises at least one of:
- a fourth transistor comprising a fourth active layer and a fourth gate which is connected to the scan line, the fourth active layer comprising a seventh electrode region, an eighth electrode region, and a fourth channel region located between the seventh electrode region and the eighth electrode region, wherein the seventh electrode region is connected to the second gate, and the eighth electrode region is connected to the fourth electrode region;
- a fifth transistor comprising a fifth active layer and a fifth gate which is connected to a control line, the fifth active layer comprising a ninth electrode region, a tenth electrode region, and a fifth channel region located between the ninth electrode region and the tenth electrode region, wherein the ninth electrode region is connected to the power line, and the tenth electrode region is connected to the second electrode region;
- a sixth transistor comprising a sixth active layer and a sixth gate connected to the control line, the sixth active layer comprising an eleventh electrode region, a twelfth electrode region, and a sixth channel region located between the eleventh electrode region and the twelfth electrode region, wherein the eleventh electrode region is connected to the fourth electrode region, and the twelfth electrode region is connected to the anode; or
- a seventh transistor comprising a seventh active layer and a seventh gate which is connected to the reset line, the seventh active layer comprising a thirteenth electrode region, a fourteenth electrode region, and a seventh channel region located between the thirteenth electrode region and the fourteenth electrode region, wherein the thirteenth electrode region is connected to the twelfth electrode region, and the fourteenth electrode region is connected to the initialization voltage line.

14. The display panel according to claim 13, wherein the first active layer, the second active layer, the third active layer, the fourth active layer, the fifth active layer, the sixth active layer and the seventh active layer are located in a same layer.

15. The display panel according to claim 1, wherein the second electrode plate and the initialization voltage line are located in a same layer.

16. The display panel according to claim 1, wherein the scan line, the first electrode plate and the reset line are located in a same layer.

17. The display panel according to claim 1, wherein the data line and the power line are located in a same layer.

18. The display panel according to claim 1, wherein two members of at least one group of following three groups are integrally provided:
- the scan line and the first gate;
- the first electrode plate and the second gate; or
- the reset line and the third gate.

19. A display device, comprising the display panel according to claim 1.

20. A manufacturing method of a display panel, comprising providing a substrate and forming a plurality of sub-pixels on the substrate, at least one sub-pixel of the plurality of sub-pixels comprising:
- a light emitting element comprising an anode and a cathode;
- a first transistor comprising a first active layer and a first gate which is connected to a scan line, the first active layer comprising a first electrode region, a second electrode region, and a first channel region located between the first electrode region and the second electrode region, wherein the first electrode region is connected to a data line, and the second electrode region is connected to a power line;
- a capacitor comprising a first electrode plate and a second electrode plate connected to the power line;
- a second transistor comprising a second active layer and a second gate which is connected to the first electrode plate, the second active layer comprising a third electrode region, a fourth electrode region, and a second channel region located between the third electrode region and the fourth electrode region, wherein the third electrode region is connected to the second electrode region, and the fourth electrode region is connected to the anode; and
- a third transistor comprising a third active layer and a third gate which is connected to a reset line, the third active layer comprising a fifth electrode region, a sixth electrode region, and a third channel region located between the fifth electrode region and the sixth electrode region, wherein the fifth electrode region is connected to the first electrode plate, and the sixth electrode region is connected to an initialization voltage line, wherein an orthographic projection of the power line on the substrate is a first projection, an orthographic projection of the reset line on the substrate is a second projection, an orthographic projection of the third channel region on the substrate is a third projection, and an orthographic projection of the data line on the substrate is a fourth projection, and wherein an region of the first projection overlapping with the second projection and the third projection is a first region, and regions of the first projection overlapping with the second projection and not overlapping with the third projection comprise a second region and a third region that are adjacent to the first region, wherein the second region is located on one side of the first region proximate to the fourth projection, and the third region is located on one side of the first region away from the fourth projection, and an area of the second region is not smaller than an area of the third region.

\* \* \* \* \*